United States Patent
Levy

(10) Patent No.: US 7,299,445 B2
(45) Date of Patent: Nov. 20, 2007

(54) NONLINEAR RECEIVER MODEL FOR GATE-LEVEL DELAY CALCULATION

(75) Inventor: Harold J. Levy, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 490 days.

(21) Appl. No.: 10/977,243

(22) Filed: Oct. 29, 2004

(65) Prior Publication Data

US 2006/0095871 A1    May 4, 2006

(51) Int. Cl.
G06F 17/50    (2006.01)
G06F 17/10    (2006.01)

(52) U.S. Cl. .................. 716/17; 716/5; 716/6; 716/18; 703/2; 703/16

(58) Field of Classification Search ............... 716/17, 716/5, 6, 18; 703/2, 16
See application file for complete search history.

(56) References Cited

U.S. PATENT DOCUMENTS

| | | | | |
|---|---|---|---|---|
| 3,683,417 | A * | 8/1972 | Gummel | 716/1 |
| 5,077,676 | A * | 12/1991 | Johnson et al. | 716/6 |
| 5,274,568 | A * | 12/1993 | Blinne et al. | 716/6 |
| 5,467,291 | A * | 11/1995 | Fan et al. | 703/14 |
| 5,610,833 | A * | 3/1997 | Chang et al. | 716/11 |
| 5,636,130 | A * | 6/1997 | Salem et al. | 716/6 |
| 6,253,359 | B1 * | 6/2001 | Cano et al. | 716/6 |
| 6,370,060 | B2 * | 4/2002 | Takata et al. | 365/185.21 |
| 6,467,068 | B1 * | 10/2002 | Iyer et al. | 716/6 |
| 6,473,890 | B1 * | 10/2002 | Yasui et al. | 716/10 |
| 6,480,996 | B1 * | 11/2002 | Aji et al. | 716/12 |
| 6,637,008 | B1 * | 10/2003 | Higuchi et al. | 716/2 |
| 6,766,264 | B2 * | 7/2004 | Jung et al. | 702/107 |
| 6,789,232 | B1 * | 9/2004 | Iyer et al. | 716/1 |
| 6,791,343 | B2 * | 9/2004 | Ramarao et al. | 324/677 |
| 7,185,298 | B2 * | 2/2007 | Corbeil et al. | 716/5 |
| 2003/0055613 | A1 * | 3/2003 | Tsai | 703/2 |
| 2003/0131322 | A1 * | 7/2003 | Roohparvar | 716/1 |
| 2004/0205678 | A1 * | 10/2004 | Tuncer et al. | 716/1 |
| 2004/0210857 | A1 * | 10/2004 | Srinivasan | 716/2 |
| 2004/0243957 | A1 * | 12/2004 | Mandry | 716/6 |
| 2005/0010883 | A1 * | 1/2005 | Wood | 716/6 |
| 2005/0114111 | A1 * | 5/2005 | Zhang et al. | 703/14 |

FOREIGN PATENT DOCUMENTS

JP            11031747 A    *    2/1999

* cited by examiner

*Primary Examiner*—Phallaka Kik
(74) *Attorney, Agent, or Firm*—Bever, Hoffman & Harms, LLP; Jeanette S. Harms

(57) ABSTRACT

A characterized cell library for EDA tools includes receiver model data that provides two or more capacitance values for a given receiver modeling situation (signal type and operating conditions). The receiver model can then use different capacitance values to generate different portions of the model receiver signal, thereby enabling more accurate matching of actual receiver signal timing characteristics. For example, a two-capacitance receiver model can be generated by using the first capacitance value to match the delay characteristics of an actual receiver, and by using the second capacitance (in light of the use of the first capacitance) to match the slew characteristics of that actual receiver. Because typical EDA timing analyses focus mainly on delay and slew (and not the detailed profile of circuit signals), a two-capacitance receiver model can provide a high degree of accuracy without significantly increasing cell library size and computational complexity.

14 Claims, 14 Drawing Sheets

| | OPER. COND. | RISE | FALL | BEST CASE | WORST CASE |
|---|---|---|---|---|---|
| CELL 230 RECEIVER MODEL | OP1 | C_ST(R1) | C_ST(F1) | C_ST(B1) | C_ST(W1) |
| | OP2 | C_ST(R2) | C_ST(F2) | C_ST(B2) | C_ST(W2) |
| | OP3 | C_ST(R3) | C_ST(F3) | C_ST(B3) | C_ST(W3) |

| OPER. COND. | RISE | FALL | BEST CASE | WORST CASE |
|---|---|---|---|---|
| OP1 | C_NL1(R1), C_NL2(R1), V_SW1(R1), C_NL3(R1), V_SW2(R1) | C_NL1(F1), C_NL2(F1), V_SW1(F1), C_NL3(F1), V_SW2(F1) | C_NL1(B1), C_NL2(B1), V_SW1(B1), C_NL3(B1), V_SW2(B1) | C_NL1(W1), C_NL2(W1), V_SW1(W1), C_NL3(W1), V_SW2(W1) |
| OP2 | C_NL1(R2), C_NL2(R2), V_SW1(R2), C_NL3(R2), V_SW2(R2) | C_NL1(F2), C_NL2(F2), V_SW1(F2), C_NL3(F2), V_SW2(F2) | C_NL1(B2), C_NL2(B2), V_SW1(B2), C_NL3(B2), V_SW2(B2) | C_NL1(W2), C_NL2(W2), V_SW1(W2), C_NL3(W2), V_SW2(W2) |
| OP3 | C_NL1(R3), C_NL2(R3), V_SW1(R3), C_NL3(R3), V_SW2(R3) | C_NL1(F3), C_NL2(F3), V_SW1(F3), C_NL3(F3), V_SW2(F3) | C_NL1(B3), C_NL2(B3), V_SW1(B3), C_NL3(B3), V_SW2(B3) | C_NL1(W3), C_NL2(W3), V_SW1(W3), C_NL3(W3), V_SW2(W3) |

CELL 230 RECEIVER MODEL

CELL ID 511

LIBRARY 500-E

CELL ENTRY 510-E

FIG. 5E

NONLINEAR RECEIVER MODEL FOR GATE-LEVEL DELAY CALCULATION

BACKGROUND OF THE INVENTION

1. Field of the Invention

The invention is in the field of electronic design automation (EDA), and more particularly, is related to receiver models for that enable accurate timing analyses.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer. The models define performance parameters for the cells; e.g., parameters related to the operational behavior of the cells, such as power consumption, delay, and noise. The netlist and cell library are typically stored in computer readable media within the EDA system and are processed and verified using many well-known techniques.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During physical verification (step E126), various checking functions are performed to ensure correctness for: manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

Finally, during mask data preparation (step E130), the "tape-out" data for production of masks for lithographic use to produce finished chips is performed. Exemplary EDA software products from Synopsys, Inc. that can be used at this step include the CATS(R) family of products.

As indicated in FIG. 1, timing analyses can be performed at various points along the EDA process, such as during synthesis, design planning, netlist verification, and analysis (as indicated by the bolded chevrons). The accuracy of these timing analyses is critical to the quality of final IC produced using EDA systems. A timing analysis is performed at the transistor level, and makes use of the performance data included in the characterized cell library. To perform a timing analysis, the IC design (or a portion of the IC) is modeled as a network of drivers and receivers. Cells designated as drivers provide stimuli to the network, and the resulting waveforms are received by the cells designated as receivers.

For example, FIG. 2A shows a schematic diagram of a sample driver-receiver network 200 that includes a driver 210 and a receiver 230. An input pin 211 of driver 210 receives a driver input signal S_IND and generates a driver output signal S_OUTD at a driver output pin 212. This signal is transmitted across an interconnect element 220 and is received as a receiver input signal S_INR at a receiver input pin 231 of receiver 230 (depicted as an inverter for exemplary purposes). Receiver 230 processes receiver input signal S_INR and generates a receiver output signal S_OUTR at a receiver output pin 232. Note that receiver 230 can also function as a driver for downstream cells, as indicated by load 240 connected to receiver output pin 232.

Because signals do not propagate instantly through a real-world circuit (e.g., due to propagation delays and parasitics), signals S_IND, S_OUTD, S_INR, and S_OUTR will have differing slew and delay characteristics. In the context of a timing analysis, "slew" represents the time required for a signal to transition between an upper threshold voltage and a lower threshold voltage (or vice versa), while "delay" represents the time required for the signal to transition from either the upper or lower rail (supply voltage) to a gate threshold voltage. Meanwhile, the gate threshold voltage typically represents the voltage at which the transistor switches state (from off to on, or vice versa).

The concepts of slew and delay are depicted in FIG. 2B, which shows a graph of a sample signal S_SAMP that represents a general signal provided to, or generated by, a cell within an IC design. Signal S_SAMP transitions between a lower rail voltage RL and an upper rail voltage RU, which represent the operating (supply) voltages for the cell. To define the slew and delay characteristics of signal S_SAMP, an upper threshold voltage THU, a lower threshold voltage THL, and a gate threshold voltage THG are selected. Upper threshold voltage THU, lower threshold voltage THL, and gate threshold voltage THG are typically selected to be predetermined percentages of the difference between rail voltages RU and RL. For example, lower threshold THL and upper threshold THU could be selected to be 20% and 80%, respectively, of the difference between upper rail voltage RU and lower rail voltage RL. Likewise, gate threshold voltage THG could be selected to be midway (i.e., 50% of the difference) between upper rail voltage RU and lower rail voltage RL.

Once lower threshold voltage THL, gate threshold voltage THG, and upper threshold voltage THV have been defined, delay and slew values can be determined for signal S_SAMP. For example, signal S_SAMP reaches gate threshold voltage THG at a time T2. Therefore, the delay value for signal S_SAMP is equal to the difference between times T2 and T0 (i.e., T2–T0). Similarly, since signal S_SAMP reaches lower threshold voltage THL and upper threshold voltage THU at times T1 and T3, respectively, the slew value for signal S_SAMP is the difference between times T3 and T1 (i.e., T3–T1). Delay and slew values can be determined in a similar manner for a signal transitioning from upper rail voltage RU to lower rail voltage RL.

In an EDA system, a characterized cell library is generated by fitting mathematical models to actual delay data (i.e., measured data or simulated (SPICE) data). Typically, a CMOS cell operating as a receiver is modeled as a single capacitor. For example, FIG. 3A shows receiver cell 230 of FIG. 2A replaced with a conventional receiver model 230-ST that includes a resistor R_ST and a capacitor C_ST serially coupled between receiver input pin 231 and ground. The value of capacitor C_ST is selected such that a model receiver input signal S_INR-ST generated by the RC circuit in response to driver output signal S_OUTD fits the actual (measured or simulated) receiver input signal S_INR. Typically, a different capacitance value is determined for rising signals, falling signals, "best case" (fastest) transitions, and "worst case" (slowest) transitions. Furthermore, since cell performance generally changes with operating conditions such as temperature and voltage, a new set of capacitance values are often generated across a range of operating conditions.

Thus, a receiver model entry in a conventional characterized cell library generally includes a set of capacitance values, with each single capacitance value being referenced by a signal type (rise, fall, best case, worst case) and set of operating conditions. For example, FIG. 3B shows a characterized library cell entry 300 for a receiver model of cell 230 (shown in FIG. 3A). Cell entry 300 includes a set of capacitance values C_ST referenced by signal type and operating conditions. For example, for a rising signal generated under operating conditions OP1, cell 230 is modeled (as a receiver) using a capacitance value C_ST(R1). Likewise, for a falling signal under the same operating conditions, cell 230 is modeled using a capacitance value C_ST(F1), while a rising signal under a set of operating conditions OP2 leads to the selection of a capacitance value C_ST(R2) to model cell 230.

Unfortunately, as device sizes continue to shrink, the behavior of a signal at a receiver can no longer be modeled by a single (static) capacitance value, as dynamic effects (e.g., the Miller Effect) begin to affect the signal shape. For example, FIG. 3C shows an actual signal S_INR-A1 (indicated by the bold curve) measured at the input pin of a receiver cell instantiated using 0.12 μm technology. Also depicted are model signals S_INR-ST1, S_INR-ST2, and S_INR-ST3 (indicated by the dashed curves), each having been generated using the above-described single-capacitance receiver model (with each of the signals being generated using a different capacitance value).

Because the curvature of signal S_INR-A1 varies significantly over the course of the signal transition, none of model signals S_INR-ST1, S_INR-ST2, and S_INR-ST3 can accurately model both the delay and slew characteristics of actual signal S_INR-A1. For example, model signal S_INR-ST1 provides a relatively good match to the actual delay of actual signal S_INR-A1. However, because model signal S_INR-ST1 reaches the upper threshold voltage THU much sooner than does actual signal S_INR-A1, the slew value generated by model signal S_INR-ST1 is much lower than the actual slew value of signal S_INR-A1. Unfortunately, while the model capacitance can be adjusted to reduce the slew error, such as in model signals S_INR-ST2 and S_INR-ST3, any such adjustment increases the model delay error.

Thus, conventional cell receiver models can be inadequate for the timing analysis of modern IC designs. Accordingly, it is desirable to provide a cell receiver model that can accurately represent the delay and slew characteristics of a CMOS cell.

SUMMARY OF THE INVENTION

To improve receiver modeling accuracy without unduly increasing cell library size or analytical complexity, a multi-capacitance receiver model can be used. For example, in one embodiment, the static capacitor used in conventional receiver models can be replaced by a two-stage non-linear capacitor. The two-stage non-linear capacitor provides a first capacitance value while the receiver model is generating a first portion of a model receiver signal, and then switches to a second capacitance value when the model receiver signal reaches a predetermined switching voltage. In other embodiments, the non-linear capacitor can switch between three or more capacitance values.

In one embodiment, a two-stage non-linear capacitor in a receiver model can include a switching voltage set to the gate threshold voltage of the cell being modeled. Then, the first capacitance value can be selected such that the delay of the model receiver signal matches the delay of the actual receiver signal, and the second capacitance value can be selected such that the slew of the model receiver signal matches the slew of the actual receiver signal. Further accuracy can be achieved by making the first and/or the second capacitances a function of the load capacitance coupled to the output of the receiver and/or the input slew of the signal provided at the input of the receiver. For example, the first and/or the second capacitances could actually be tables of capacitance values indexed (referenced by) different receiver load capacitances and/or input slew values.

In another embodiment, a cell library entry for a receiver can be generated by translating actual receiver timing data into a receiver model that incorporates a non-linear capacitor receiver model. For example, the non-linear capacitor can be defined as a two-stage capacitor. A first value of the two-stage capacitor can be selected such that the receiver model exhibits the same delay as the actual receiver cell, while a second value of the two-stage capacitor can be selected such that the receiver model exhibits the same slew as the actual receiver cell.

The matching of the model receiver signal portions to the actual receiver signal portions can be performed using receiver input signals or receiver output signals. Furthermore, instead of matching timing characteristics such as delay and slew, the matching operation can compare the profiles of the model receiver signal portions and the corresponding actual receiver signal portions. In another embodiment, greater accuracy (i.e., a closer fit to the actual signal profile) can be achieved by increasing the number of different capacitance values assigned to the non-linear capacitor during generation of the model receiver signal.

In another embodiment, a timing analysis can be performed using a receiver model incorporating a non-linear capacitor. The non-linear capacitor is initially assigned a first capacitance value, and a driver output signal is applied to the receiver model to cause the receiver model to generate a receiver signal. When the receiver signal reaches a first signal voltage, the non-linear capacitor switches to a second capacitance value. Generation of the receiver signal continues in this manner (i.e., switching capacitance values at predetermined signal voltages) until the receiver signal reaches a maximum voltage (generally a supply voltage). The receiver signal can then be applied to downstream cells, or signal characteristics (such as delay and slew) can be extracted from the receiver signal as part of the timing analysis.

The invention will be more fully understood in view of the following description and drawings.

BRIEF DESCRIPTION OF THE DRAWINGS

FIGS. 5B-5E are sample cell libraries that include multi-capacitance receiver models.

DETAILED DESCRIPTION

Figure 4A:
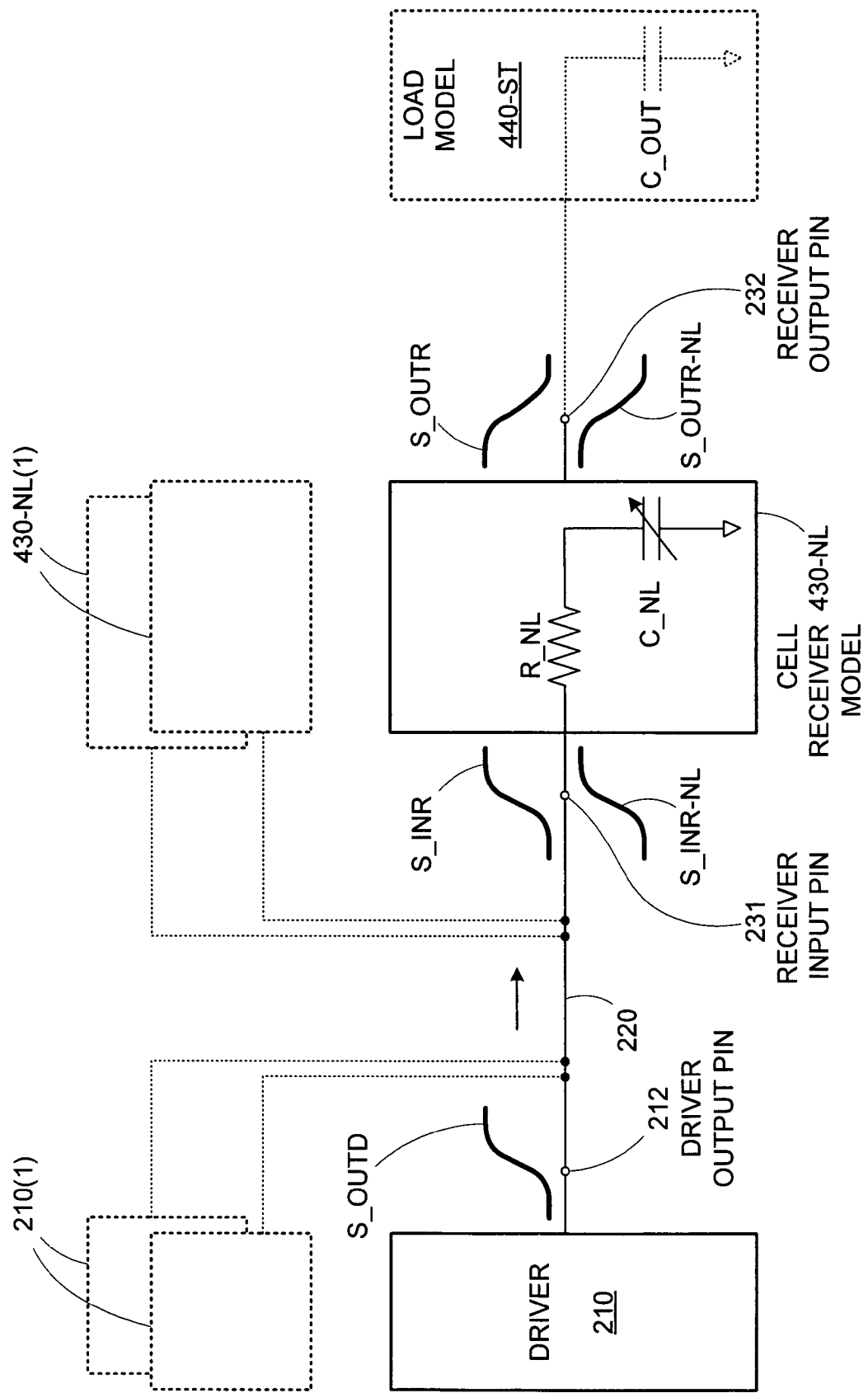
FIG. 4A is a schematic diagram of a driver-receiver network that incorporates a multi-capacitance receiver model.

Because of the various dynamic effects that become more significant as device geometries are reduced in size, conventional single-capacitance receiver models used in EDA systems can no longer provide accurate timing simulations. FIG. 4A shows a multi-capacitance receiver model that overcomes this deficiency.

Figure 1:
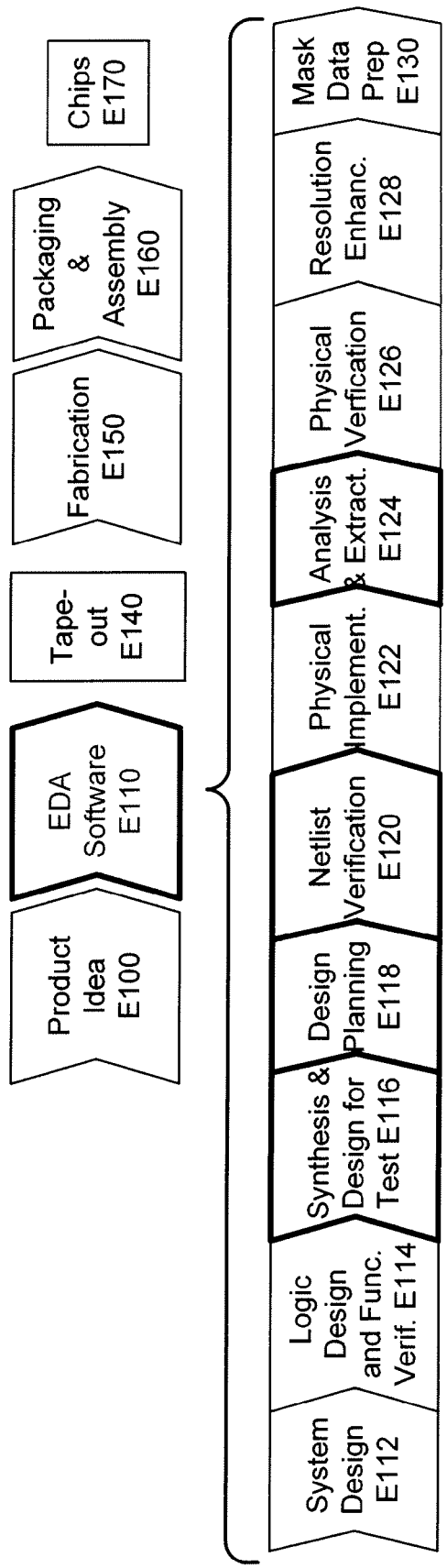
FIG. 1 is a process flow diagram for a general EDA design flow.
Figure 2A:
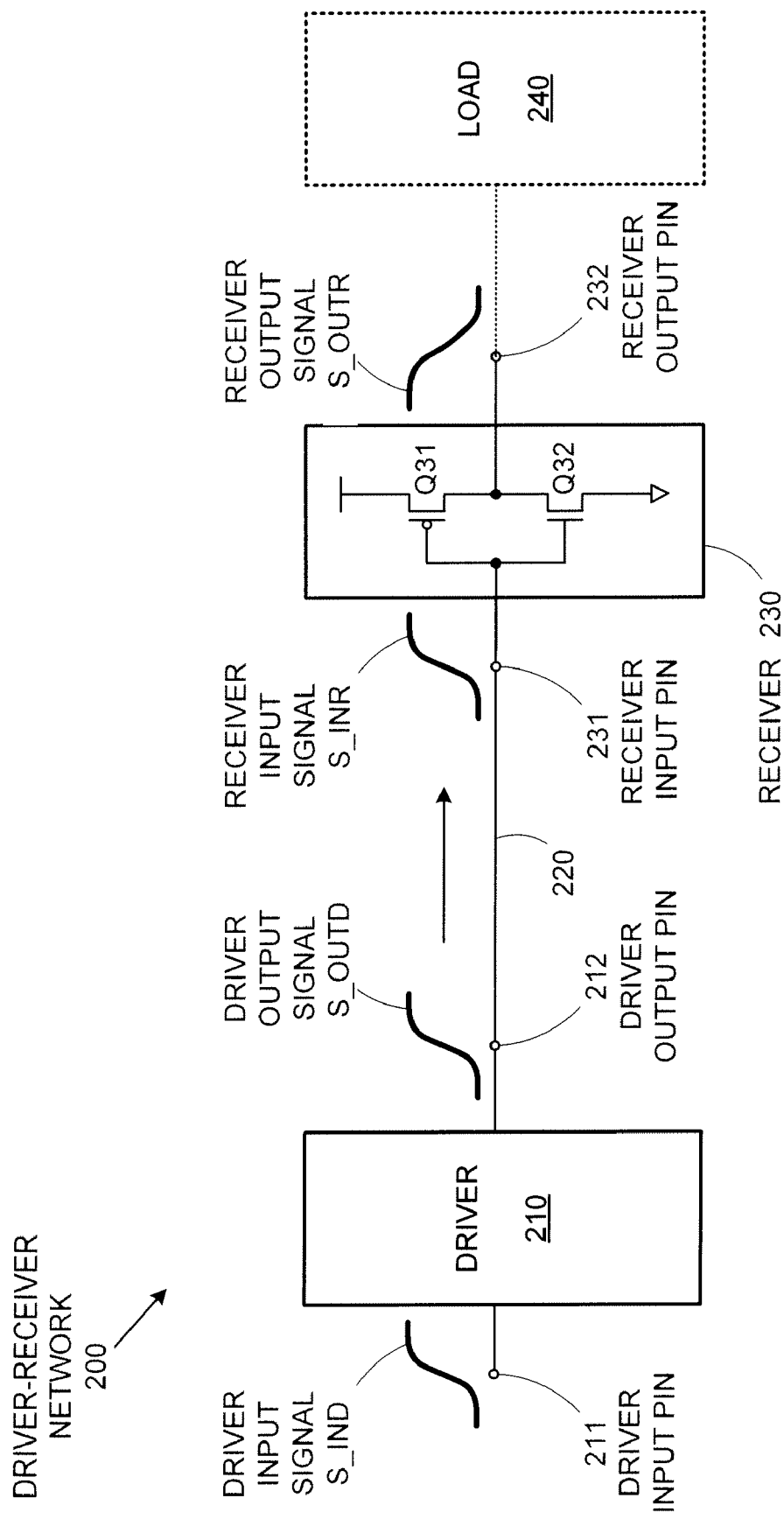
FIG. 2A is a schematic diagram of a sample driver-receiver network.
Figures 3A, 3B:
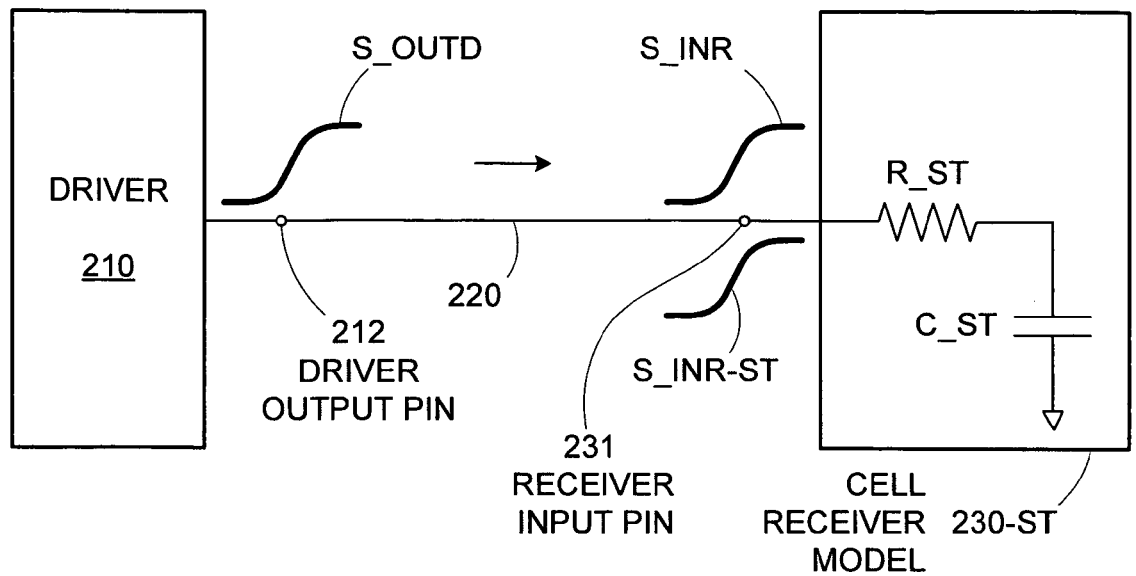
FIG. 3A is a schematic diagram of a conventional receiver model.
FIG. 3B is a sample cell entry for a conventional receiver model in a cell library.

FIG. 4A models driver-receiver network 200 shown in FIG. 2A by replacing receiver 230 with a cell receiver model 430-NL that includes a resistor R_NL and a non-linear capacitor C_NL serially coupled between receiver input pin 231 and ground. Like cell receiver model 230-ST shown in FIG. 3A, cell receiver model 430-NL generates a model receiver input signal S_INR-NL in response to driver output signal S_OUTD provided by driver cell 210.

However, unlike static capacitor C_ST in cell receiver model 230-ST, non-linear capacitor C_NL in cell receiver model 430-NL does not provide a single, static capacitance over an entire signal transition. Rather, non-linear capacitor C_NL switches between different capacitance values at predetermined signal voltages as receiver model 430-NL is generating model receiver input signal S_INR-NL (or model receiver output signal S_OUTR-NL). The capacitance values for non-linear capacitor C_NL are selected such that the signals generated by cell receiver model 430-NL match the timing characteristics of the actual signals (S_INR and/or S_OUTR) generated within the driver-receiver network 200 (shown in FIG. 2A).

For example, in one embodiment, non-linear capacitor C_NL provides two different capacitance values, switching from the first capacitance value to the second capacitance value when the model receiver input signal reaches the gate threshold voltage of the cell being modeled. The first capacitance value can be selected to cause the delay of model receiver input signal S_INR-NL to match the delay of actual receiver input signal S_INR, while the second capacitance value can be selected to cause the slew of signal S_INR-NL to match the slew of signal S_INR. Note that for this and other types of non-linear capacitance-based models, different sets of first capacitance and second capacitance values (and gate threshold voltages) could be generated for different signal types (e.g., rising, falling, best case, and worst case signals) and for different operating conditions (e.g., different temperatures and operating voltages).

Note further that while the non-linear capacitance-based model is described with respect to a single driver and single cell receiver model for clarity, in various other embodiments, any number of additional drivers 210(1) and any number of additional cell receiver models 430-NL(1) can be coupled to interconnect 220. Each additional cell receiver models 430-NL(1) could then include a non-linear capacitor as described with respect to cell receiver model 430-NL.

Figure 3C:
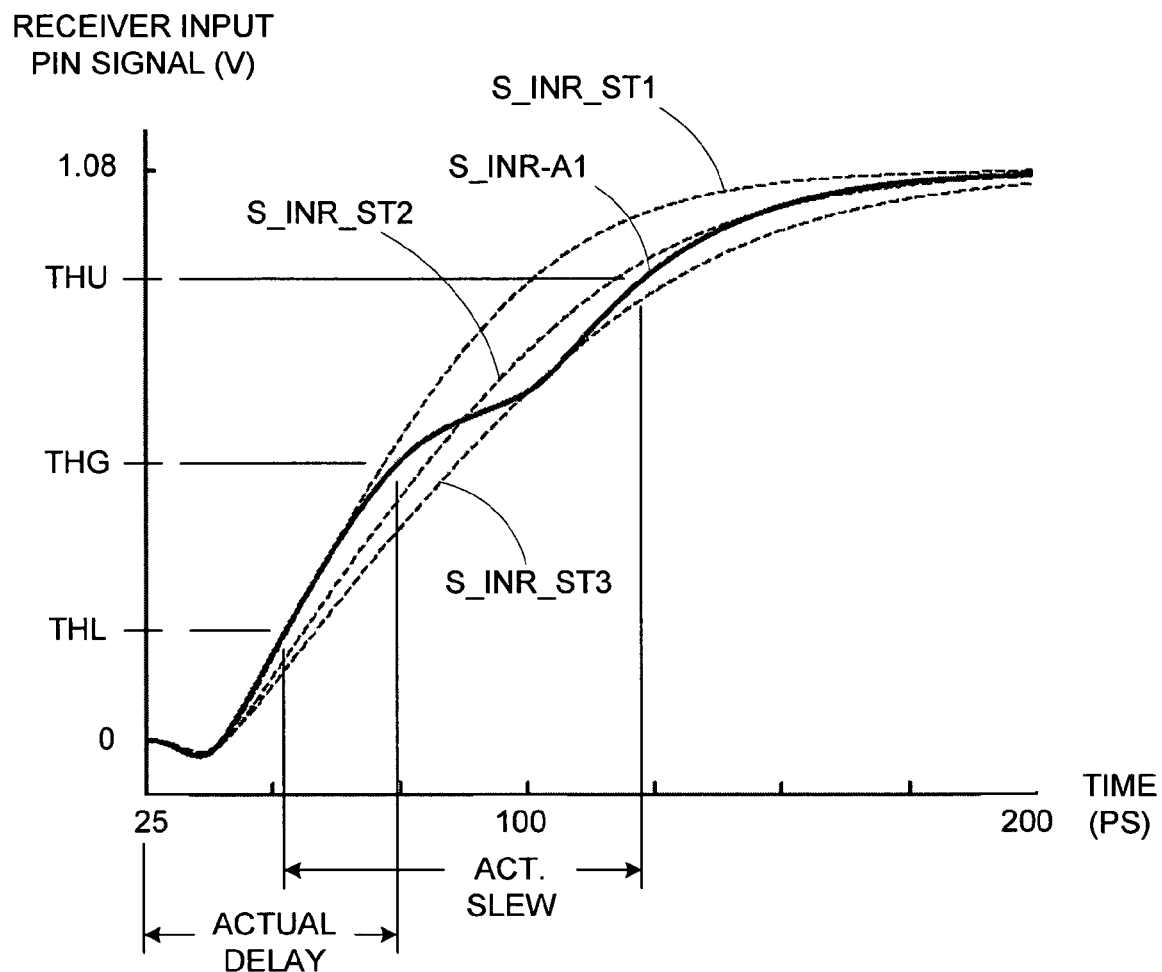
FIG. 3C is a graph of conventional model receiver signals compared to an actual receiver signal.
Figure 4B:
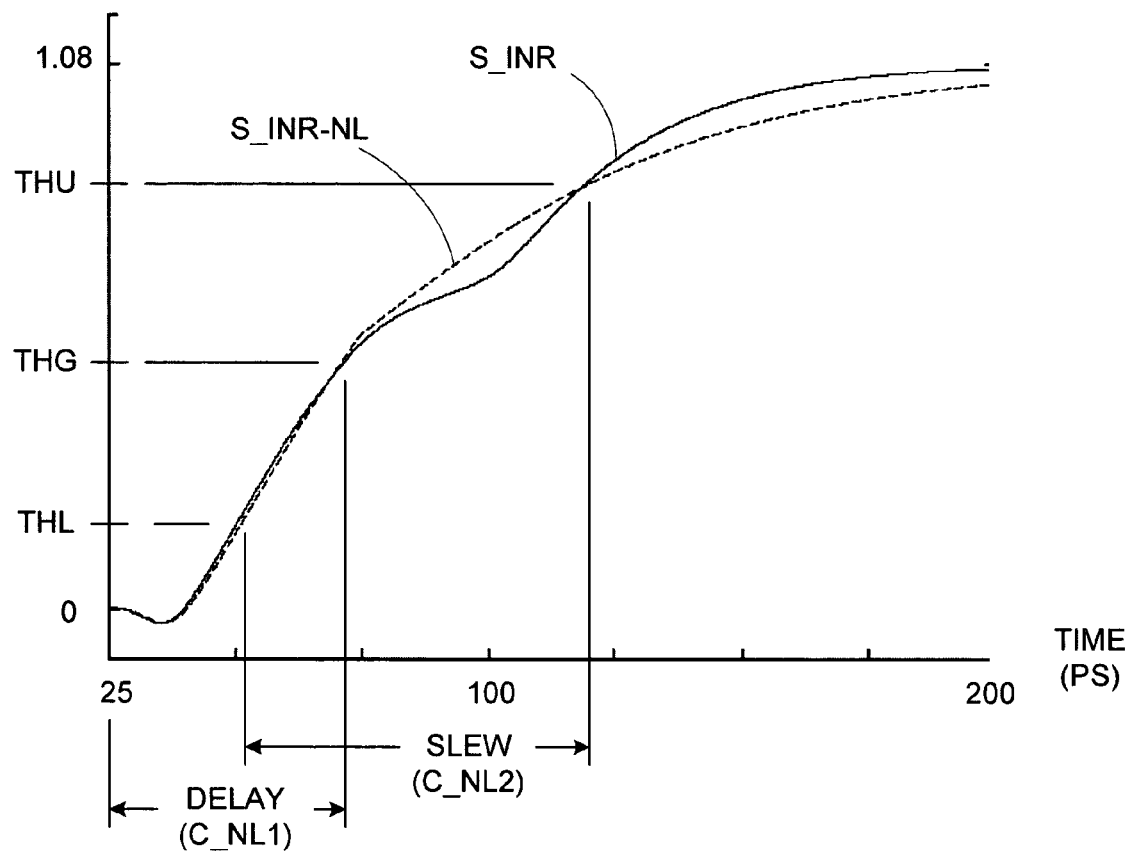
FIG. 4B is a graph of a multi-capacitance model receiver signal compared to an actual receiver signal.

FIG. 4B shows an example of this "two-stage capacitance" approach used to fit a receiver model to actual data. The graph of FIG. 4B includes same actual receiver input signal S_INR shown in FIG. 3C (i.e., 0.12 μm technology cell acting as a receiver). As described above with respect to FIG. 3C, signal S_INR exhibits the type of curvature variations that can become more prominent as device sizes are reduced in size.

However, rather than modeling signal S_INR using a conventional single capacitance model, in FIG. 4B actual signal S_INR is modeled by a two-capacitance receiver model that generates a model receiver input signal S_INR-NL. The portion of signal S_INR-NL from 0V to gate threshold voltage THG is generated using a first capacitance C_NL1, while the portion of signal S_INR-NL from gate threshold voltage THG to upper rail 1.08V is generated using a second capacitance C_NL2. Capacitances C_NL1 and C_NL2 are selected such that the delay and slew characteristics of model receiver input signal S_INR-NL match those of actual receiver input signal S_INR (to within a desired tolerance).

Note that switching from capacitance C_NL1 to C_NL2 when the model receiver signal reaches the gate threshold voltage essentially covers switching from capacitance C_NL1 to C_NL2 exactly at, just before, or just after the model receiver signal reaches gate threshold voltage, since the timing model accuracy will generally not be affected significantly by any of these situations. Note also that while the graph of FIG. 4B depicts the capacitance switch as being performed at the gate threshold voltage of the cell being modeled (i.e., either the actual gate threshold voltage of the cell (from measurements or simulations) or a predetermined gate threshold voltage such as 50% of the rail-to-rail voltage), according to other embodiments, the switch can be performed at any selected receiver signal voltage.

Note further that even though the specific profile of model receiver input signal S_INR-NL does not exactly match the profile of actual receiver input signal S_INR, the timing characteristics of interest (i.e., the delay and slew) of model receiver input signal S_INR-NL are substantially the same as those of actual receiver input signal S_INR. Therefore, the dual-capacitance model (capacitance values C_NL1 and C_NL2) can be used to provide an accurate cell receiver model.

For exemplary purposes, capacitance values C_NL1 and C_NL2 are described as being derived by fitting the model receiver input signal S_INR-NL to the actual receiver input signal S_INR. In another embodiment, first capacitance C_NL1 could be selected to cause the delay of model receiver output signal S_OUTR-NL to match the delay of actual receiver output signal S_OUTR, while second capacitance C_NL2 could be selected to cause the slew of model receiver output signal S_OUTR-NL to match the slew of actual receiver output signal S_OUTR (shown in FIG. 4A).

Because the goal of a model is typically to provide an accurate output, selecting first and second capacitances C_NL1 and C_NL2 based on a fit to the receiver output signal can often provide the most accurate modeling results. However, since such an approach will generally depend on the load connected to receiver output pin 232 (e.g., capacitance C_OUT in load model 440-ST), a different set of capacitance values for non-linear capacitor C_NL could be required for each different loading configuration (each different value of a load capacitance C_OUT at receiver output pin 232 (shown in FIG. 4A)). Because a given receiver may be coupled to a wide variety of different loads in an IC design, this output-based receiver modeling can sometimes result in increased library file size.

In another embodiment, the first capacitance C_NL1 and/or the second capacitance C_NL2 can themselves be sets of capacitances that are based on the load capacitance C_OUT at receiver output pin 232 and/or the input slew at receiver input pin 231. This allows cell receiver model 430-NL to account for any coupling that occurs between receiver input pin 231 and receiver output pin 232 once the cell "turns on". Thus, for example, the first capacitance C_NL1 and/or the second capacitance C_NL2 could be represented by tables of capacitance values indexed by input slew and/or output capacitance. Exemplary capacitance tables for first capacitance C_NL1 and second capacitance C_NL2 are provided below as tables 1 and 2, respectively.

TABLE 1

First Capacitance Values

|  | C_OUT1 | C_OUT2 | C_OUT3 | C_OUT4 | C_OUT5 |
| --- | --- | --- | --- | --- | --- |
| IN_SLEW1 | C_NL1-a1 | C_NL1-b1 | C_NL1-c1 | C_NL1-d1 | C_NL1-e1 |
| IN_SLEW2 | C_NL1-a2 | C_NL1-b2 | C_NL1-c2 | C_NL1-d2 | C_NL1-e2 |

TABLE 2

Second Capacitance Values

|  | C_OUT1 | C_OUT2 | C_OUT3 | C_OUT4 | C_OUT5 |
| --- | --- | --- | --- | --- | --- |
| IN_SLEW1 | C_NL2-a1 | C_NL2-b1 | C_NL2-c1 | C_NL2-d1 | C_NL2-e1 |
| IN_SLEW2 | C_NL2-a2 | C_NL2-b2 | C_NL2-c2 | C_NL2-d2 | C_NL2-e2 |

The first capacitance values C_NL1 and second capacitance values C_NL2 in tables 1 and 2, respectively, are indexed by input slew values IN_SLEW1 and IN_SLEW2, and output capacitances C_OUT1 through C_OUT5. Note that just as with the above-described two-value non-linear capacitance models, different sets (tables) of capacitance values and switching voltages could be determined for different signal type-operating condition combinations.

Figure 5A:
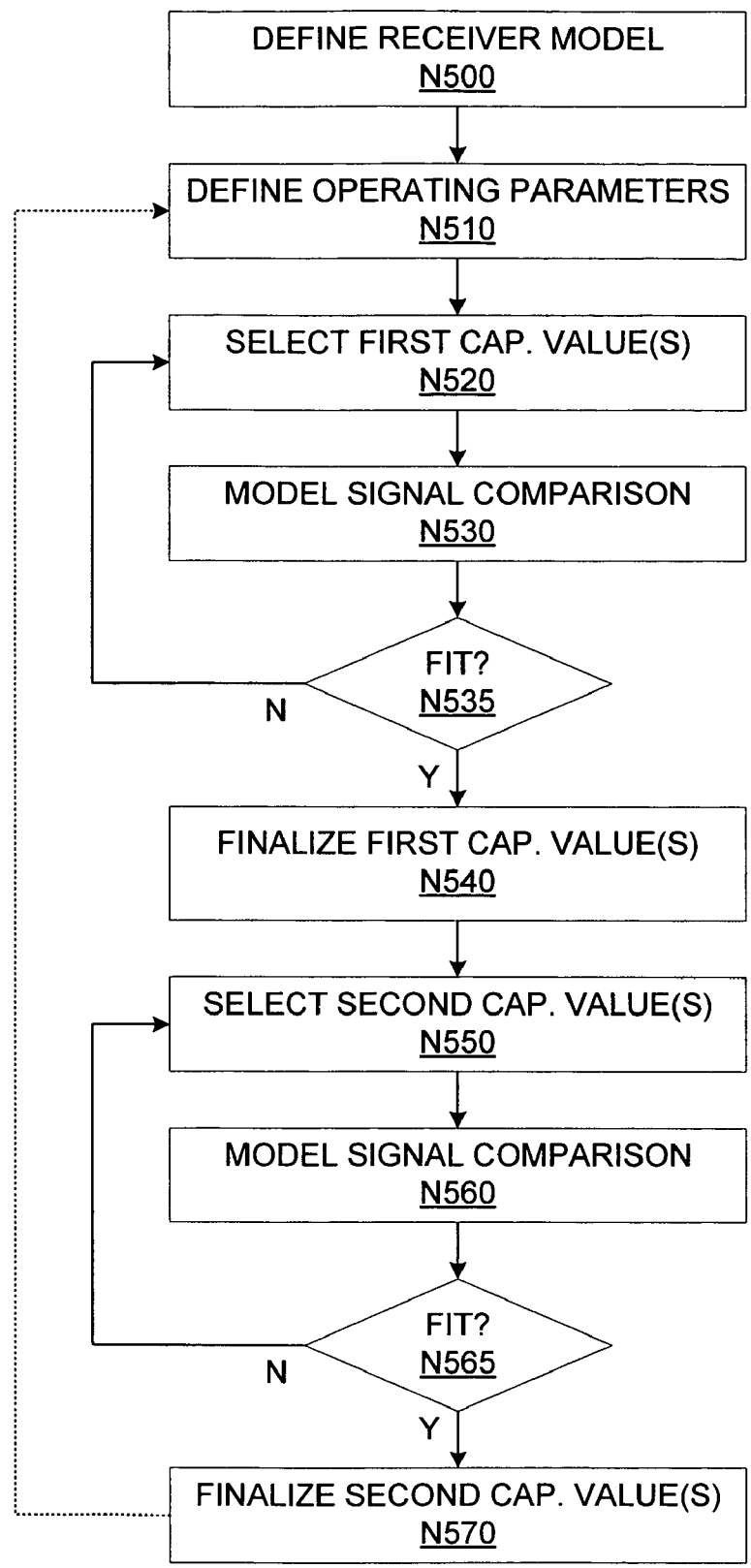
FIG. 5A is a flow diagram of a multi-capacitance receiver model generation process.

FIG. 5A shows a flow diagram for an exemplary process for generating a two-stage capacitance receiver model (as described above with respect to FIGS. 4A and 4B). The receiver model can be defined in an optional "DEFINE RECEIVER MODEL" step N500. Specifically, the characteristics of the non-linear capacitor (e.g., capacitor C_NL in FIG. 4B) in the receiver model can be defined (e.g., switching voltage(s), static or load-dependent capacitance values).

In a "DEFINE OPERATING PARAMETERS" step N510, values for the relevant operating parameters are defined. For example, an output (load) capacitance for receiver can be specified. Also, a current input signal for the receiver is determined. For example, the receiver cell (e.g., receiver 230 in FIG. 2A) is provided with a voltage signal (e.g., driver output signal S_OUTD) having a predetermined slew, and the current flow into the receiver cell is determined (via testing or simulation). This current input signal can then be used for model generation purposes. Alternatively, the current input signal for the receiver can be derived by applying the driver output current signal to the receiver cell (where only a portion of the driver output current may flow into the receiver cell as the current input signal).

In a "SELECT FIRST CAPACITANCE VALUE(S)" step N520, a test first capacitance value (e.g., capacitance C_NL1 in FIG. 4B) is selected for the receiver model. Then, in a "MODEL SIGNAL COMPARISON" step N530, the receiver model performance is evaluated using the output capacitance value and the current input signal determined in step N510.

As noted above with respect to FIGS. 4A and 4B, the comparison performed in step N530 can be between the receiver model input voltage signal and the actual receiver input voltage signal, or between the receiver model output voltage signal and the actual receiver output voltage signal. In either case, a target fit between the receiver model (input/output) signal and the actual receiver (input/output) signal is assessed in a "FIT?" step N535. In one embodiment, the target fit could be a match between the model delay value and the actual delay value (generally a match to within 5% of the actual delay value will provide sufficient accuracy for most timing analyses). In another embodiment, the target fit could be a match between the profile of the portion of the model receiver signal generated using the first capacitance value and the profile of the corresponding portion of the actual receiver signal. Various other fit definitions can be used in other embodiments. In any case, if the target fit is achieved, the first capacitance value is finalized in a "FINALIZE FIRST CAPACITANCE VALUE(S)" step N540. Otherwise, the process iterates back to step N510 where a new first capacitance value is selected.

Once the first capacitance value is determined, a test second capacitance value (e.g., capacitance C_NL2 in FIG. 4B) is selected in a "SELECT SECOND CAPACITANCE VALUE(S)" step N550. Once again, in a "MODEL SIGNAL COMPARISON" step N560, the receiver model performance with the test second capacitance value is evaluated using the output capacitance value and the current input signal determined in step N510.

As described with respect to steps N530 and N535, a target fit between the receiver model signal and the actual receiver signal is evaluated in a "FIT?" step N565. In this case, the target fit could be a match between the profile of the receiver model signal generated using the second capacitance value and the profile of the corresponding portion of the actual receiver signal. Alternatively, the target fit could be a match between the model slew and the actual slew (as with the delay modeling described above, a match to within 5% of the actual slew value will generally provide sufficient accuracy for most timing analyses).

Figure 2B:
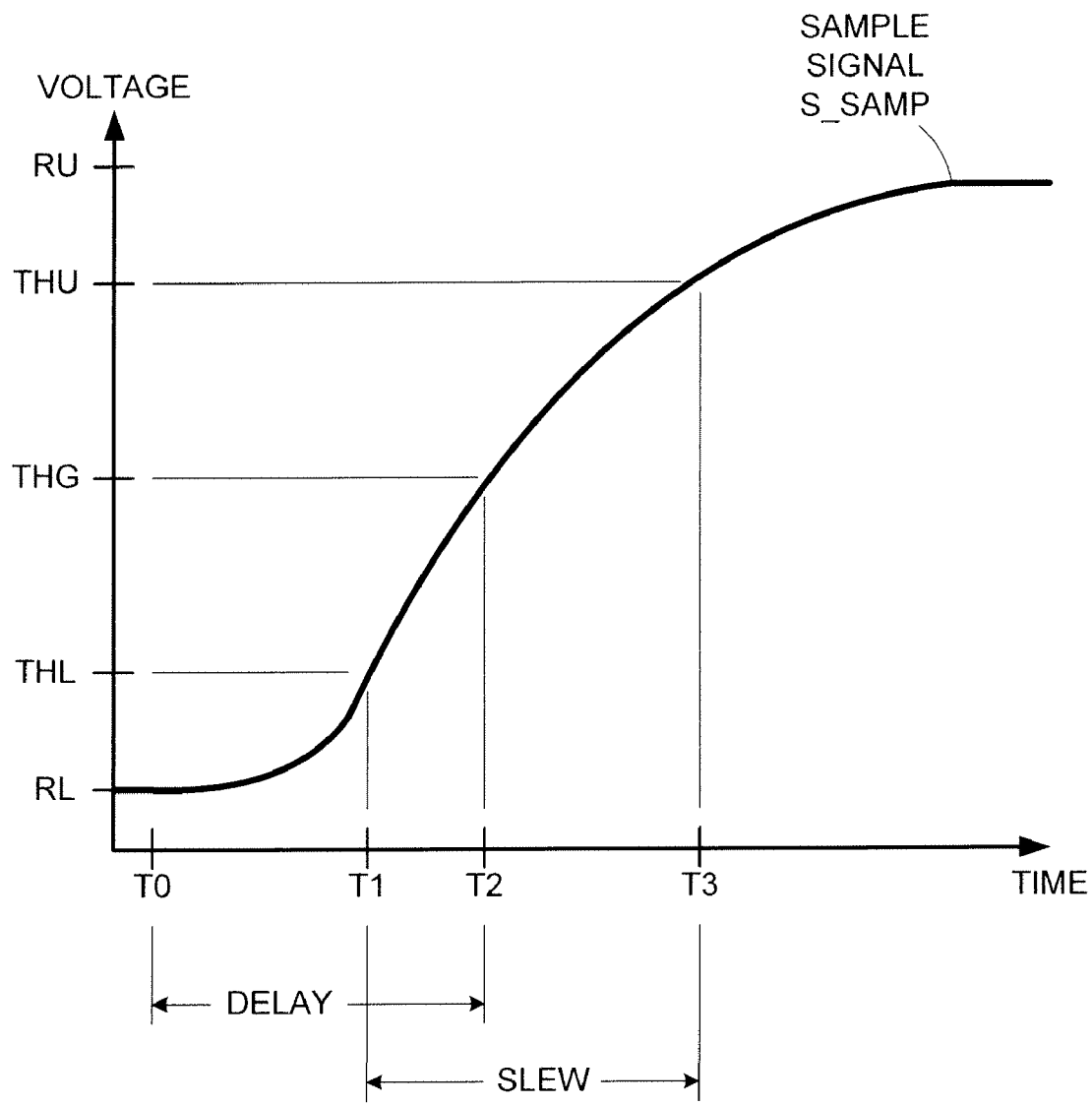
FIG. 2B is a graph of a sample signal within a load-receiver network.

Note that the slew performance of a two-capacitance receiver model depends on both the value of the first capacitance and the value of the second capacitance. This slew-dependence on both capacitances is due to the fact that delay is measured between a rail voltage and a switching voltage (as described with respect to FIG. 2B), whereas slew is measured between a lower threshold voltage and an upper threshold voltage. Therefore, the first capacitance controls the portion of the slew between the lower threshold voltage and the switching voltage (or between the upper threshold voltage and the switching voltage for a falling signal).

Thus, the model slew in the comparison of step N570 can be generated by adding the time required for the model signal to transition from the lower threshold voltage to the switching voltage using the first capacitance value, and the time required for the model signal to transition from the switching voltage to the upper threshold voltage using the test second capacitance value. The resulting model slew (for either the receiver input signal or the receiver output signal) can then be compared with the actual receiver slew (for the input signal or output signal, respectively).

If the target fit is detected in step N575, then the second capacitance value is finalized in a "FINALIZE SECOND CAPACITANCE VALUE(S)" step N570. Otherwise, the process iterates back to step N550, where a new test second capacitance value is selected. As part of this finalization, both the first and second capacitance values can be associated with the cell in a cell library (described in greater detail below with respect to FIG. 5B).

Note that once a particular first capacitance/second capacitance set of values is finalized in step N570, the process can loop back to step N510 (indicated by the dotted line). Then, new input slew and/or output capacitance values can be specified for the generation of additional first capacitance/second capacitance sets. Note further that while the flow diagram in FIG. 5A provides a two-stage model generation process for exemplary purposes, the process can be readily extended for any number of stages (i.e., any number of different capacitance values for non-linear capacitor C_NL in FIG. 4B).

Figure 5B:
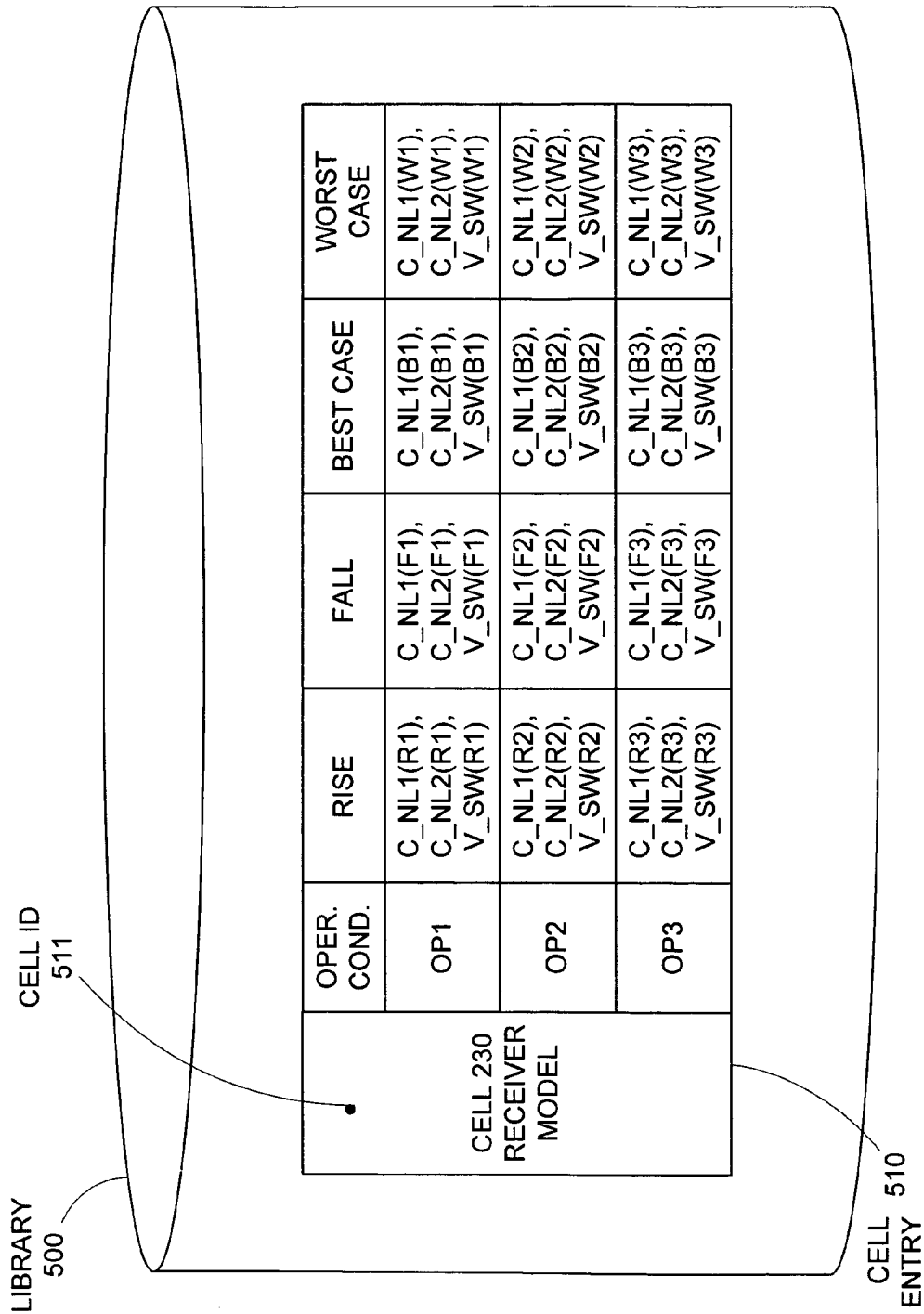

FIG. 5B shows an embodiment of a characterized cell library 500 that incorporates a non-linear capacitance receiver model, such as described with respect to FIG. 4A. A cell entry 510 in library 500 includes a cell identifier 511 and multiple sets of model definition values. Each set of model definition values includes first capacitance C_NL1, a second capacitance C_NL2, and a switching voltage V_SW. As described above with respect to FIGS. 4A and 4B, first capacitance C_NL1 can be used as the receiver model until the receiver input signal reaches switching voltage V_SW, at which point second capacitance C_NL2 (which can comprise a single (static) capacitance value or table of capacitances) is used for the receiver model.

Each set of model values is referenced by a particular combination of operating conditions (OP1-OP3) and signal types (RISE, FALL, BEST CASE, and WORST CASE). For example, for a rising receiver input signal under operating conditions OP1, cell 230 is modeled as a receiver by a first capacitance C_NL1(R1), a second capacitance C_NL2(R1), and a switching voltage V_SW(R1). Similarly, for a falling receiver input signal under operating conditions OP2, cell 230 is modeled as a receiver by a first capacitance C_NL1(F2), a second capacitance C_NL2(F2), and a switching voltage V_SW(F2). Each set of model values could be generated by the process described with respect to FIG. 5A.

Figure 5C:
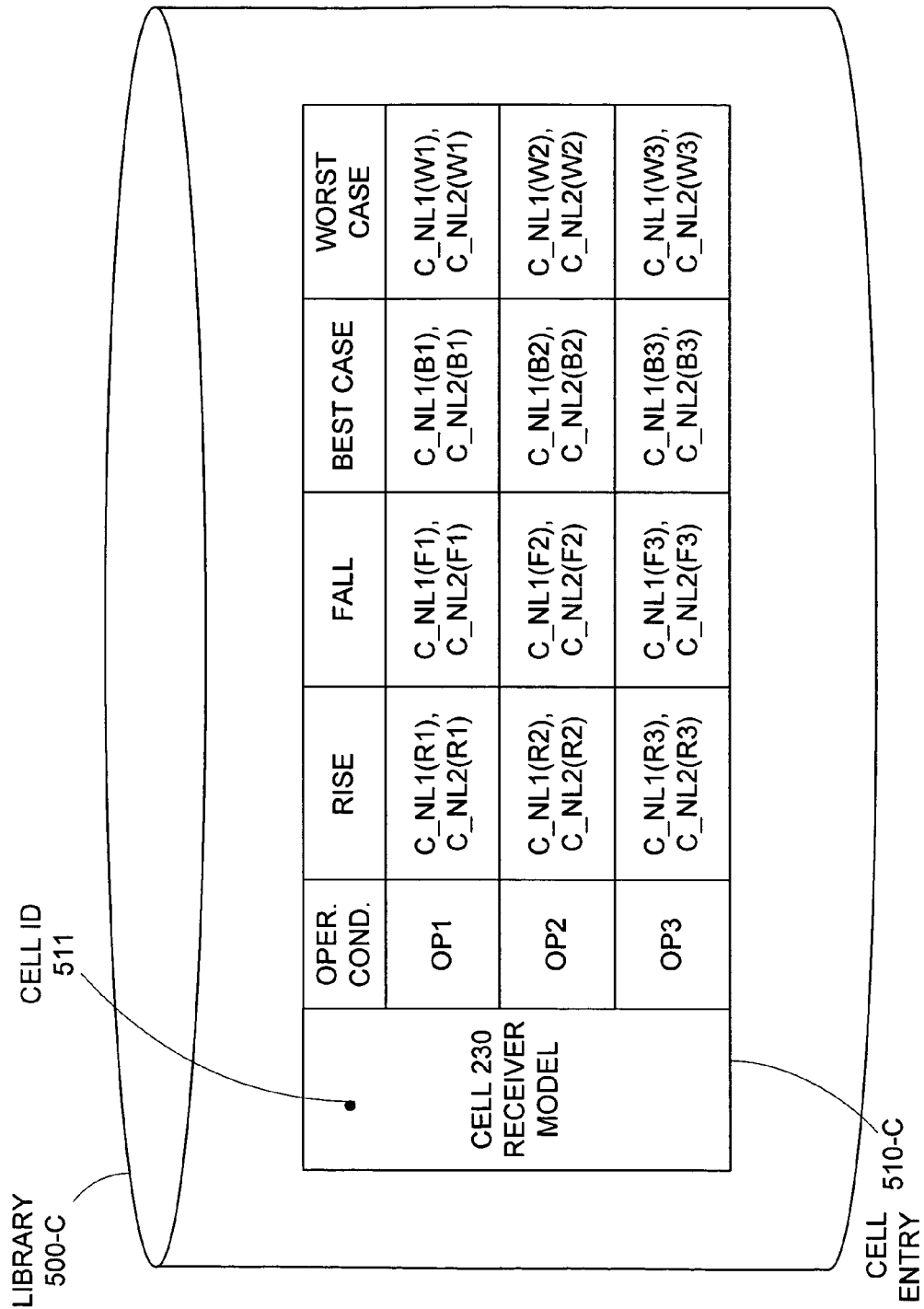

Note that while four different signal types and three different operating conditions are shown for exemplary purposes, a cell entry for a multi-capacitance receiver model can include any number of signal types and any number of operating conditions. Note further that the same switching voltage can be applied to all receiver models in a library to simplify library generation and usage. The use of a standard switching voltage (e.g., midway between the upper and lower power rail for all receiver models) can also reduce library size, since each set of model definition values would then only include two capacitance values, as shown in FIG. 5C. A cell entry 510-C on a library 500-C is substantially similar to cell entry 510 shown in FIG. 5B, except that each set of model definition values only includes a first capacitance value C_NL1 and a second capacitance value C_NL2. The switching voltage is associated with cell identifier 511 (or even library 500-C) as a whole, and therefore need not be included within individual sets of model definition values.

Figure 5D:
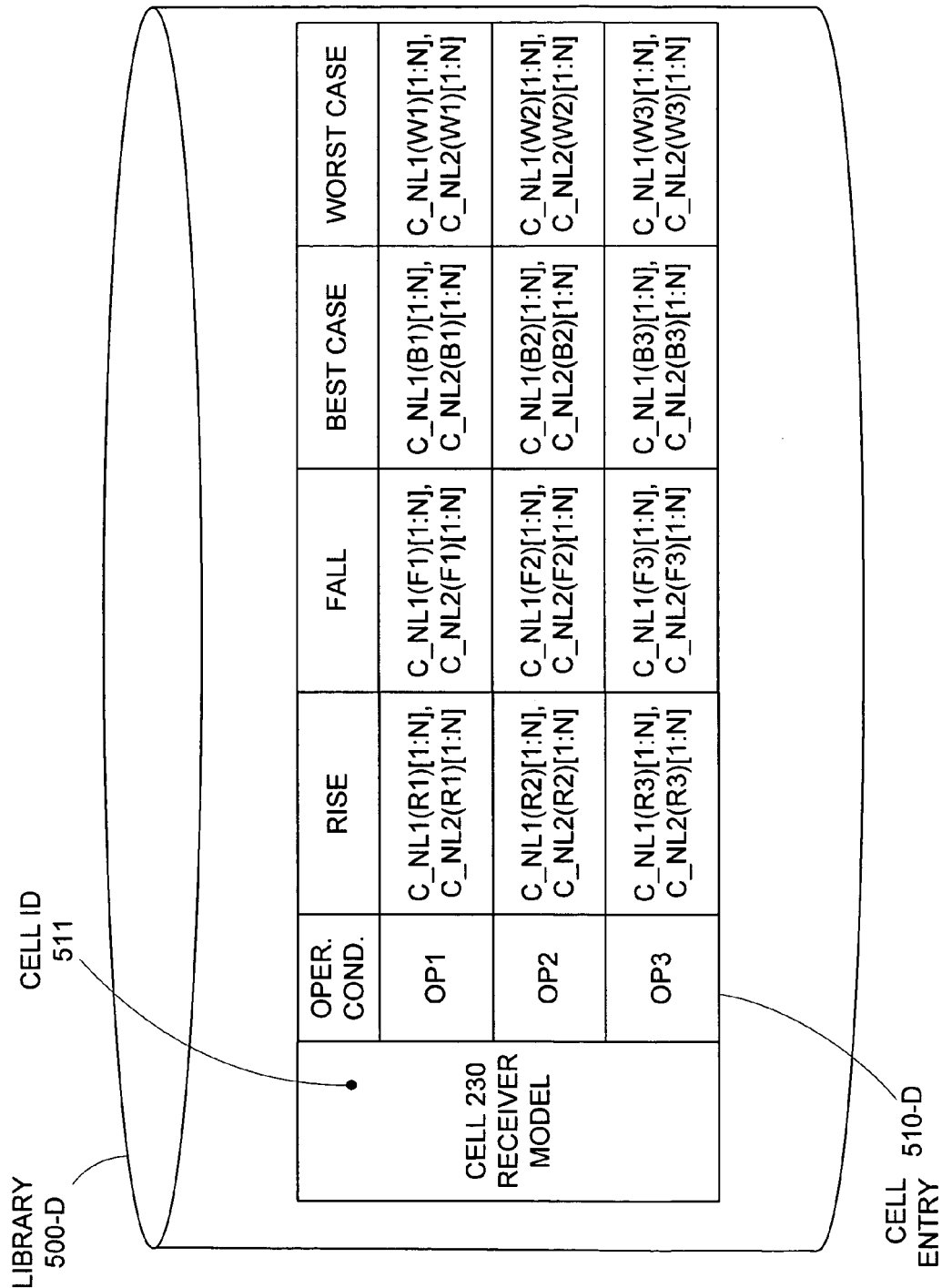

Note also that as described above with respect to FIG. 4B, second capacitance C_NL2 can itself comprise multiple capacitance values that are based on the load capacitance applied to the receiver. For example, FIG. 5D shows a cell library 500-D that includes a cell entry 510-D. Cell entry 510-D is substantially similar to cell entry 510-C shown in FIG. 5C, except that each first capacitance entry C_NL1 and each second capacitance value C_NL2 is now a function of the receiver load capacitance and/or input slew. For example, the set of model definition values referenced by a rising signal and operating conditions OP1 includes a second capacitance C_NL2(R1)[1:N], indicating that second capacitance C_NL2(R1)[1:N] can take any of N different values, with each of the capacitance values being indexed by a particular combination of load capacitance and/or input slew applied to cell 230. In one embodiment, first capacitance values C_NL1 and second capacitance values C_NL2 can be represented as tables of capacitance values, such as tables 1 and 2, respectively.

Note further that while only two different capacitances are shown for each set of model definition values, according to other embodiments, each set of model definition values can include any number of capacitance values. For example, multiple capacitance values could be selected to generate a model receiver signal that closely matches the actual receiver signal (rather than simply matching the delay and slew characteristics of the actual receiver signal). For example, the actual receiver signal could be divided into segments, and a different capacitance value could be selected for each segment.

FIG. 5E shows an exemplary embodiment of a characterized cell library 500-E that incorporates a non-linear capacitance receiver model based on more than two capacitance values. Each set of model definition values in a cell entry 510-E in library 500-E includes first capacitance C_NL1, a second capacitance C_NL2, a third capacitance C_NL3, a first switching voltage V_SW1, and a second switching voltage V_SW. First capacitance C_NL1 can be used as the receiver model until the receiver input signal reaches first switching voltage V_SW1, at which point the receiver model switches to second capacitance C_NL2. Modeling is performed using second capacitance C_NL2 until the receiver input signal reaches second switching voltage V_SW2, at which point the receiver model switches to third capacitance C_NL3 to generate the remainder of the receiver signal.

Figure 6:
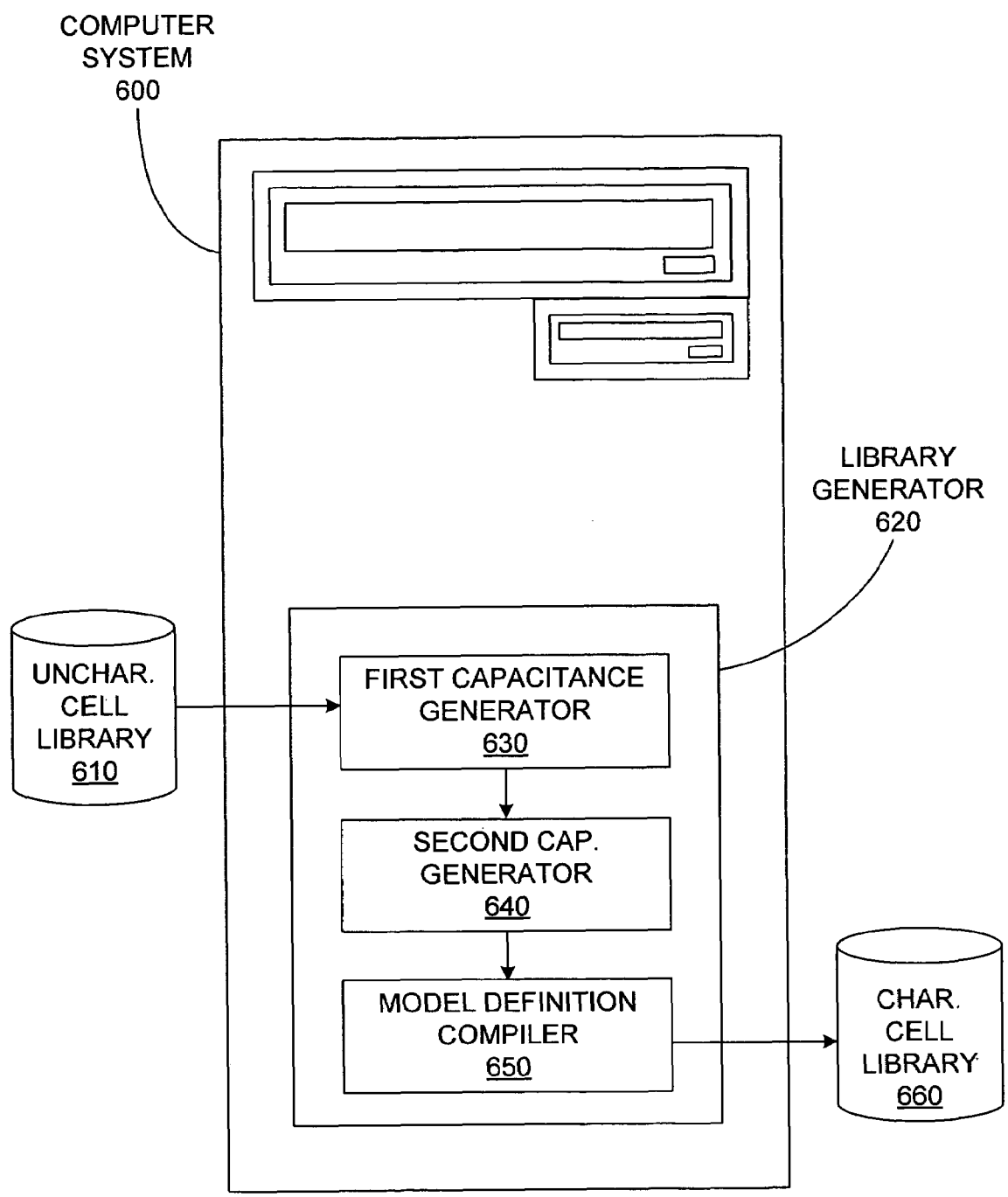
FIG. 6 is a diagram of a computing system that includes logic for generating a multi-capacitance receiver model.

FIG. 6 shows a block diagram of a computer system 600 that includes a library generator 620 for translating an uncharacterized cell library 610 (which includes actual receiver signal data) into a characterized cell library 660. The embodiment of library generator 620 shown in FIG. 6 includes a first capacitance generator for generating a first capacitance for a two-capacitance receiver model (e.g., steps N510-N540 in FIG. 5A), a second capacitance generator for generating a second capacitance (or set of capacitances) for the two-capacitance receiver model (steps N550-N570 in FIG. 5A), and a model definition compiler 650 for compiling model definition data (one or more sets generated by generators 630 and 640) into a characterized cell library 660. Characterized cell library 660 can be written to some form of computer-readable medium, such as memory within computer system 600, a removable storage medium (e.g., CDROM or DVD), or a network storage location.

Figure 7:
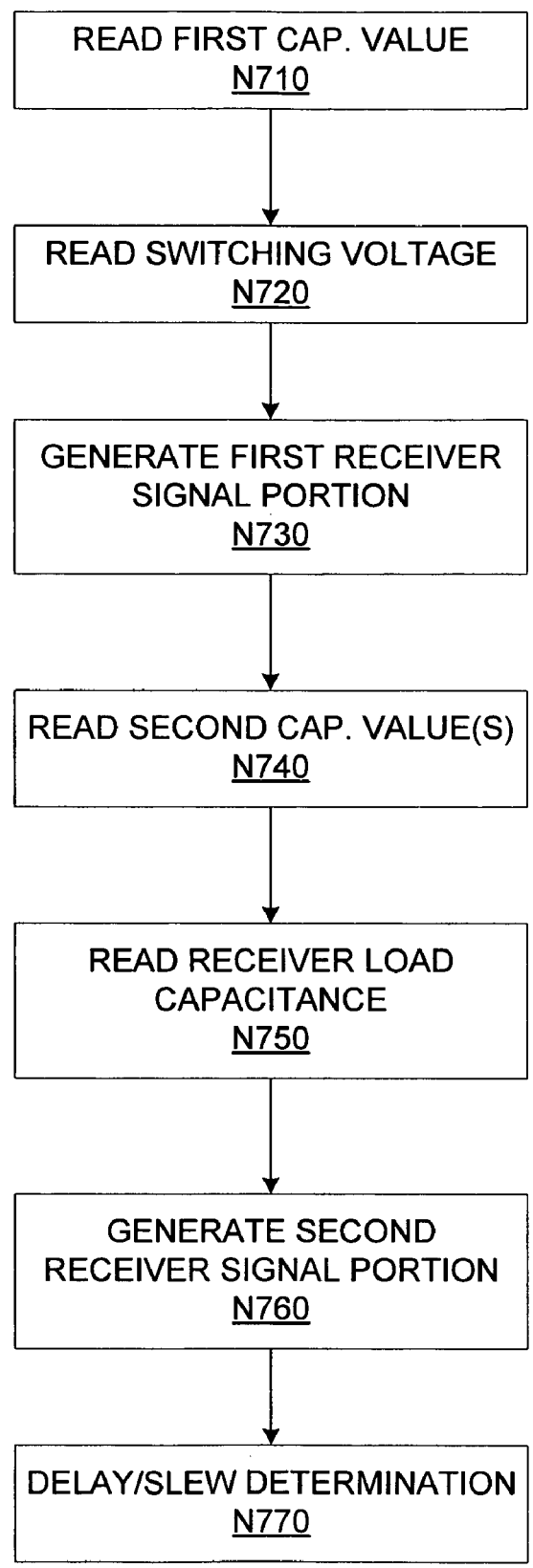
FIG. 7 is a flow diagram of a process for performing a timing analysis using a multi-capacitance receiver model.

FIG. 7 shows a flow diagram for an embodiment of an analysis process (e.g., synthesis or static timing analysis) using a characterized cell library that includes a two-capacitance receiver model. In a "READ FIRST CAPACITANCE VALUE" step N710, a first capacitance value (e.g., C_NL1 described with respect to FIG. 5B) is read from the cell library. In an optional "READ SWITCHING VOLTAGE" step N720, a switching voltage (e.g., V_SW described with respect to FIG. 5B) is also read from the cell library. Note that if a general switching voltage has been predefined (e.g., as in cell entry 510-C in FIG. 5C), step N720 can be skipped.

Then, a first portion of the model receiver signal (either the input signal or the output signal) is generated in a "GENERATE FIRST RECEIVER SIGNAL PORTION" step N730. A second capacitance value (e.g., C_NL2 from FIG. 5B) is then read from the cell library in a "READ SECOND CAPACITANCE VALUE(S)" step N740. Note that if the second capacitance is a function of the receiver load capacitance (e.g., as described with respect to FIG. 5D), the load capacitance coupled to the receiver can be read in an optional "READ RECEIVER LOAD CAPACITANCE" step N750.

The remainder of the model receiver signal is generated in a "GENERATE SECOND RECEIVER SIGNAL PORTION" step N760. Then, from the completed model receiver signal, the model delay and slew values can be determined, in a "DELAY/SLEW DETERMINATION" step N770.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for creating a characterized cell library, the method comprising:

defining a receiver model for a cell, the receiver model comprising a non-linear capacitor;

selecting a first value for the non-linear capacitor;

applying a driver signal to the non-linear capacitor at the first value to generate a first portion of a model receiver signal from a first supply voltage to a first signal voltage;

adjusting the first value for the non-linear capacitor until the first portion of the model receiver signal provides a first target fit to an actual receiver signal for a cell;

selecting a second value for the non-linear capacitor in the receiver model;

applying the driver signal to the non-linear capacitor at the second value to generate a second portion of the model receiver signal from the first signal voltage to a second signal voltage;

adjusting the second value for the non-linear capacitor until the model receiver signal provides a second target fit to the actual receiver signal for the cell; and compiling the first value for the non-linear capacitor and the second value for the non-linear capacitor in a first cell entry in the characterized cell library, the first cell entry being referenced by an identifier for the first cell.

2. The method of claim 1, wherein the first signal voltage comprises a gate threshold voltage for the cell,
wherein the second signal voltage comprises a second supply voltage,
wherein the first target fit comprises a first match between a delay value for the first portion of the model receiver signal and a delay value for the actual receiver signal, and
wherein the second target fit comprises a second match between a slew value for the model receiver signal and a slew value for the actual receiver signal.

3. The method of claim 1, wherein the driver signal comprises a receiver input current signal for the cell, the receiver input current signal being generated by applying a driver output voltage signal to the cell and measuring current flow into the cell.

4. The method of claim 1, wherein the driver signal comprises a receiver input current signal for the cell, the receiver input current signal for the cell being generated by applying a driver output current signal to the cell and measuring current flow into the cell.

5. The method of claim 1, wherein the model receiver signal is a receiver input voltage signal for the receiver model, and
wherein the actual receiver signal is a receiver input voltage signal for the cell.

6. The method of claim 1, wherein the model receiver signal is a receiver output voltage signal for the receiver model, and
wherein the actual receiver signal is a receiver output voltage signal for the cell.

7. The method of claim 1, wherein applying the driver signal to the non-linear capacitor at the first value further comprises applying a first load capacitance to an output terminal of the receiver model, and
wherein compiling the first value for the non-linear capacitor and the second value for the non-linear capacitor in the first cell entry comprises storing the first value for the non-linear capacitor in a table, the first non-linear value being indexed in the table by at least one of the first load capacitance and a slew of a driver output voltage signal.

8. The method of claim 1, wherein applying the driver signal to the non-linear capacitor at the second value comprises applying a first load capacitance to an output terminal of the receiver model, and
wherein compiling the first value for the non-linear capacitor and the second value for the non-linear capacitor in the first cell entry comprises storing the second value for the non-linear capacitor in a table, the second non-linear value being indexed in the table by at least one of the first load capacitance and a slew of a driver output voltage signal.

9. The method of claim 1, further comprising:
selecting a third value for the non-linear capacitor in the receiver model;
applying the driver signal to the non-linear capacitor at the third value to generate a third portion of the model receiver signal from the second signal voltage to a third signal voltage;
adjusting the third value for the non-linear capacitor until the model receiver signal provides a third target fit to the actual receiver signal for the cell; and associating the third value for the non-linear capacitor, the first signal voltage, and the second signal voltage with the identifier for the first cell.

10. The method of claim 9, wherein the first target fit comprises a first match between the first portion of the model receiver signal and a first portion of the actual receiver signal between the first supply voltage and the first signal voltage,
wherein the second target fit comprises a second match between the second portion of the model receiver signal and a second portion of the actual receiver signal between the first signal voltage and the second signal voltage, and
wherein the third target fit comprises a third match between the third portion of the model receiver signal and a third portion of the actual receiver signal between the second signal voltage and the third signal voltage.

11. A computer-readable medium comprising instructions that, when run on a computer, perform steps to generate a characterized cell library entry, the steps comprising:
selecting a first capacitance value for a non-linear capacitor in a receiver model;
applying a driver output signal to the receiver model to generate a receiver model signal;
adjusting the first capacitance value until the receiver model signal provides a first match to an actual receiver signal;
selecting a second capacitance value for the non-linear capacitor in the receiver model;
switching the non-linear capacitor from the first capacitance value to the second capacitance value when the receiver model signal reaches a first signal voltage;
adjusting the second capacitance value until the receiver model signal provides a second match to the actual receiver signal; and
generating the characterized cell library entry based on adjusted first and second capacitance values.

12. The computer-readable medium of claim 11, wherein the first signal voltage comprises a gate threshold voltage for the receiver model,
wherein the first match comprises a match between a delay of the receiver model signal and a delay of the actual receiver signal, and
wherein the second match comprises a match between a slew of the receiver model signal and a slew of the actual receiver signal.

13. A computer-readable medium embodying instructions that, when executed by a computer, generate a characterized cell library entry, the instructions comprising:
instructions for selecting a first capacitance value for a non-linear capacitor in a receiver model, the first capacitance value being associated with a delay of the receiver model;
instructions for selecting a second capacitance value for the non-linear capacitor in the receiver model, the second capacitance value being associated with a slew of the receiver model; and
instructions for generating the characterized cell library entry based on the first and second capacitance values.

14. A method for creating a cell library entry for a cell, the cell generating an actual receiver signal in response to a driver output signal, the method comprising:
defining a receiver model for the cell, the receiver model comprising a non-linear capacitor, and the receiver model being configured to generate a model receiver signal in response to the driver output signal;

selecting a first capacitance value, wherein when the selected first capacitance value is assigned to the non-linear capacitor, a delay of the model receiver signal matches a delay of an actual receiver signal generated by the cell in response to the driver output signal;

selecting a second capacitance value, wherein when the selected first capacitance value is assigned to the non-linear capacitor until the model receiver signal reaches a switching voltage and the non-linear capacitor switches to the selected second capacitance value, a slew of the model receiver signal matches a slew of the actual receiver signal; and generating the cell library entry based on the first and second capacitance values.

* * * * *